United States Patent
Ting et al.

(10) Patent No.: US 12,094,983 B2
(45) Date of Patent: Sep. 17, 2024

(54) DISPLAY DEVICE

(71) Applicant: InnoLux Corporation, Miao-Li County (TW)

(72) Inventors: Chin-Lung Ting, Miao-Li County (TW); Cheng-Hsu Chou, Miao-Li County (TW); Ming-Chun Tseng, Miao-Li County (TW); Yun-Sheng Chen, Miao-Li County (TW); Chih-Hsiung Chang, Miao-Li County (TW); Liang-Lu Chen, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 409 days.

(21) Appl. No.: 17/504,759

(22) Filed: Oct. 19, 2021

(65) Prior Publication Data
US 2022/0157998 A1 May 19, 2022

(30) Foreign Application Priority Data
Nov. 16, 2020 (CN) .......................... 202011278538.0

(51) Int. Cl.
*H01L 29/786* (2006.01)
(52) U.S. Cl.
CPC .. *H01L 29/78696* (2013.01); *H01L 29/78618* (2013.01)

(58) Field of Classification Search
None
See application file for complete search history.

(56) References Cited

U.S. PATENT DOCUMENTS 5,731,613 A * 3/1998 Yamazaki ......... H01L 29/78654
257/E27.111
2018/0190645 A1* 7/2018 Long ....................... H02H 9/00

FOREIGN PATENT DOCUMENTS

CN 111092093 A 5/2020

* cited by examiner

*Primary Examiner* — Bo B Jang
(74) *Attorney, Agent, or Firm* — McClure, Qualey & Rodack, LLP

(57) ABSTRACT

A display device is provided. The display device includes a substrate, a channel layer, a first metal layer, and a second metal layer. The channel layer is disposed on the substrate and includes a first channel layer and a second channel layer. The first metal layer is disposed on the channel layer and includes a first gate and a second gate. The second metal layer is disposed over the first metal layer and includes a first source, a first drain, and a second source. The first gate, the first source, the first drain, and the first channel layer form a first transistor. The second gate, the second source, the first drain, and the second channel layer form a second transistor. The first transistor and the second transistor are connected in parallel.

19 Claims, 5 Drawing Sheets

DISPLAY DEVICE

CROSS REFERENCE TO RELATED APPLICATIONS

This Application claims priority of China Patent Application No. 202011278538.0, filed on Nov. 16, 2020, the entirety of which is incorporated by reference herein.

BACKGROUND OF THE INVENTION

Field of the Invention

The present disclosure relates to a display device, and, in particular, to a display device in which the gate and source/drain are disposed in a concentric manner.

Description of the Related Art

In display devices, thin film transistors (TFT) are widely used to drive pixels (e.g. light-emitting units). However, the thin film transistors currently in use still have some problems. For novel display devices, a relatively large current is often required to drive the light-emitting units. However, if a single transistor is used to drive a light-emitting unit, the single transistor may suffer excessive current, which may shorten the lifespan or decrease the reliability of the single transistor.

The hump effect of transistors will cause a decrease in reliability. In the current thin film transistors, the edge regions on both sides of the channel layer have a sloped profile. In these edge regions, the thin layer (e.g. the gate insulating layer) between the channel layer and the gate may have an uneven thickness. For example, the thickness of the gate insulating layer on the edge region is less than the thickness of the gate insulating layer on the central region. Therefore, in the edge regions, edge TFTs that are different from central TFTs are formed.

In edge TFTs, thinner gate insulating layers may trap electrons (or holes) due to the gate voltage during operating. After these electrons (or holes) are accumulated, the hump effect will occur and the threshold voltage (Vth) of the device will be shifted. The shift of Vth will affect the characteristics of the device, especially the switching characteristics, it make the device cannot operate normally at a preset voltage or current, thereby reducing the reliability of the device.

Therefore, there is a need for a display device that can integrate a plurality of thin film transistors to provide a large current and thereby increase the durability of the thin film transistors. Alternatively, there is a need for a thin film transistor that can solve the hump effect and increase the reliability of the thin film transistor.

BRIEF SUMMARY OF THE INVENTION

An embodiment of the present invention provides a display device. The display device comprises a substrate, a channel layer, a first metal layer, and a second metal layer. The channel layer is disposed on the substrate and includes a first channel layer and a second channel layer. The first metal layer is disposed on the channel layer and includes a first gate and a second gate. The second metal layer is disposed over the first metal layer and includes a first source, a first drain, and a second source. The first gate, the first source, the first drain, and the first channel form a first transistor. The second gate, the second source, the first drain, and the second channel layer form a second transistor. The first transistor and the second transistor are connected in parallel.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion. It is also emphasized that the drawings appended illustrate only typical embodiments of this disclosure and are therefore not to be considered limiting in scope, for the disclosure may apply equally well to other embodiments.

DETAILED DESCRIPTION OF THE INVENTION

Figure 1:
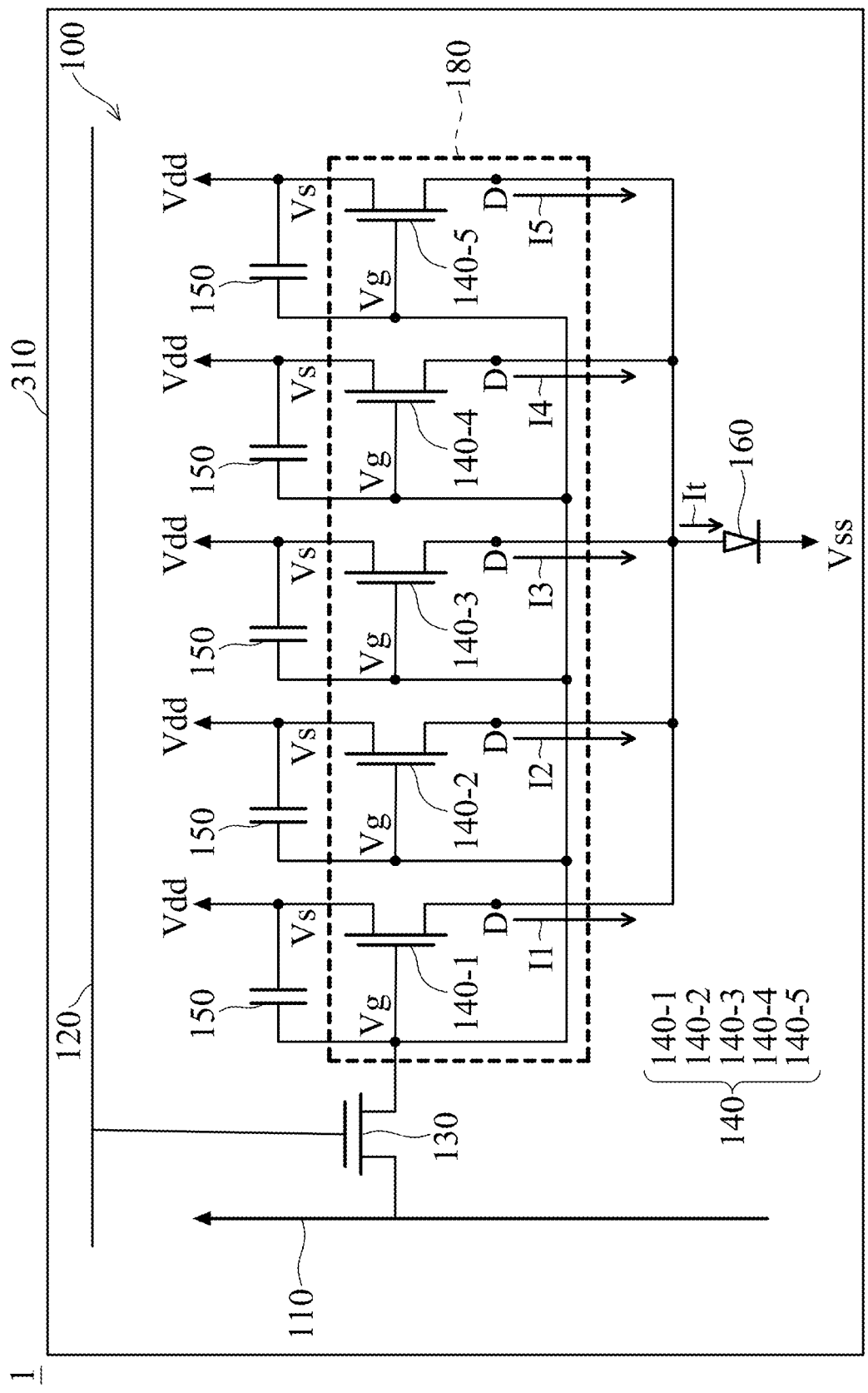
FIG. 1 is a schematic diagram of a circuit, in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Furthermore, unless specifically disclaimed, the singular includes the plural and vice versa. And when a number or a range of numbers is described with "about," "approximate," and the like, the term is intended to encompass numbers that are within a reasonable range including the number described, such as within +/− 10% of the number described or other values as understood by person skilled in the art.

In the present disclosure, the length, and width may be measured by using an optical microscope (OM), and the thickness may be measured from a section image in a scanning electron microscope (SEM), but the present disclosure is not limited thereto. In addition, there may be a certain error in any two values or directions used for comparison. In the present disclosure, the features between various embodiments can be mixed and matched arbitrarily as long as they do not violate the spirit of the invention or conflict between each other.

The present disclosure provides an electronic device, the electronic device may comprise a display device, an antenna device, a sensing device, or a splicing device, but the present disclosure is not limited thereto. It should be noted that, the electronic device may be any arrangement and combination of the above devices, but the present disclosure is not limited thereto. Hereinafter, the display device will be used as an electronic device or a splicing device to illustrate the content of the present disclosure, but the present disclosure is not limited thereto. The electronic device of the present disclosure can be implemented using the circuit 100 shown in FIG. 1.

FIG. 1 illustrates a schematic diagram of a circuit 100 in a display device 1, in accordance with some embodiments of the resent disclosure. In some embodiments, the display device 1 may comprise a substrate 310, the circuit 100, and a light-emitting unit 160. The circuit 100 may be disposed on the substrate 310. The circuit 100 may be a driving circuit of the light-emitting unit 160. The circuit 100 comprises a data line 110, a scan line 120, a switching transistor 130, driving transistors 140, and storage capacitors 150. In the embodiments of the present disclosure, the switching transistor 130 and the driving transistors 140 may be thin film transistors, but the present disclosure is not limited thereto. In some embodiments, a single pixel can be defined as the region where the signal line and the scan line are interwoven. Moreover, for example, the switching transistor 130, the driving transistors 140, the light-emitting unit 160, and the storage capacitors 150 described above (but not limited thereto) may be disposed in the single pixel, but the present disclosure is not limited thereto.

The substrate 310 may be a rigid substrate or a flexible substrate. In some embodiments, the material of the rigid substrate may include glass, quartz, ceramic, sapphire, or plastic, etc., but the present disclosure is not limited thereto. In some embodiments, the material of the flexible substrate may include polycarbonate (PC), polyimide (PI), polypropylene (PP) or polyethylene terephthalate (PET), other suitable materials, or combinations thereof, but the present disclosure is not limited thereto. In other embodiments, the substrate 310 may include a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphorous, but the resent disclosure is not limited thereto. In some embodiments, the thickness of the substrate 310 (measured along the Z direction) may be greater than or equal to 0.3 millimeter and less than or equal to 1 millimeter, but the present disclosure is not limited thereto.

In the embodiment illustrated in FIG. 1, the circuit 100 comprises, for example, five driving transistors 140 connected in parallel, such as a driving transistor 140-1, a driving transistor 140-2, a driving transistor 140-3, a driving transistor 140-4, and a driving transistor 140-5 signed in FIG. 1. However, it should be noted that, the resent disclosure is not limited to five driving transistors 140 connected in parallel. In other embodiments, the circuit 100 produced by the manufacturer according to actual application requirements may include any suitable number of driving transistors 140.

In the embodiment illustrated in FIG. 1, the circuit 100 may comprise five electronic units, one of the five electronic units is 2T1C (a switching transistor, a driving transistor, and a capacitor), and the remaining four electronic units are 1T1C (a driving transistor, a capacitor, and sharing the switching transistor with the 2T1C electronic unit). For example, in FIG. 1, the switching transistor 130, the driving transistor 140-1, and one of the capacitors 150 form a first electronic unit. The driving transistor 140-2 and one of the capacitors 150 form a second electronic unit. The driving transistor 140-3 and one of the capacitors 150 form a third electronic unit. The driving transistor 140-4 and one of the capacitors 150 form a fourth electronic unit. The driving transistor 140-5 and one of the capacitors 150 form a fifth electronic unit. In addition, the second electronic unit, the third electronic unit, the fourth electronic unit, and the fifth electronic unit can share the switching transistor 130 in the first electronic unit, but the disclosure is not limited thereto.

In some embodiments, the five electronic units comprised in the circuit 100 may all be 2T1C, it means that each driving transistor can be equipped with a switching transistor. In these embodiments, not all the driving transistors will fail due to the failure of one switching transistor. In some other embodiments, each electronic unit may include any number of transistors. For example, each electronic unit may include additional transistors other than one switching transistor and one driving transistor, such as a second switching transistor, but the present disclosure is not limited thereto. However, as described above, the present disclosure is not limited to five driving transistors 140 connected in parallel, and therefore is not limited to five electronic units. In other embodiments, the circuit 100 may comprise any suitable number of electronic units.

In the circuit 100, the scan line 120 is electrically connected to the gate of the switching transistor 130 to control the turn-on/off of the switching transistor 130. The second electrode of the switching transistor 130 is electrically connected to the gate of the driving transistor 140 (e.g. the driving transistor 140-1) and provides a gate voltage Vg to control the turn-on/off of the driving transistor 140. The first voltage Vdd is connected to the first electrode of the driving transistor 140 and provides a voltage Vs. The storage capacitors 150 are connected to the gates and the first electrodes of the driving transistors 140 to stabilize the voltage across the gates and the first electrodes.

The nodes D of the second electrode terminals of each driving transistor 140 are connected together so that each driving transistor 140 is connected in parallel with each other, for example, the driving transistor 140-1 to the driving transistor 140-5 are connected in parallel with each other. The nodes D are connected to the anode of the light-emitting unit 160 to provide current to the light-emitting unit 160. More particularly, as shown in FIG. 1, the current flowing through the driving transistor 140-1 is current I1, the current flowing through the driving transistor 140-2 is current I2, the current flowing through the driving transistor 140-3 is current I3, the current flowing through the driving transistor 140-4 is current I4, and the current flowing through the driving transistor 140-5 is current I5. The total current It may be the sum of the current I1, the current I2, the current I3, the current I4, and the current I5. The total current It flows through the light-emitting unit 160 and causes the light-emitting unit 160 to emit light. It is worth noting that, when the circuit 100 needs to provide a larger total current It for the light-emitting unit 160, a plurality of driving transistors 140 can be connected in parallel. In this way, the magnitude of the current (e.g. the current I1 to the current I5) passing through each driving transistor 140 can be reduced, and thus the durability of the driving transistors 140 can be enhanced and the lifetime of the driving transistors 140 can be increased.

The light-emitting unit 160 may be a light-emitting diode, including an organic light-emitting diode (OLED), a mini LED, a micro LED, a quantum dot (QD) LED (e.g. QLED or QD-LED), a fluorescence, a phosphor, other suitable materials, or combinations thereof, but the disclosure is not limited thereto. The cathode of the light-emitting unit 160 is connected to the second voltage Vss (e.g. ground).

In FIG. 1, a dashed block 180 is used to indicate a plurality of drive transistors 140 connected in parallel. In the embodiment illustrated in FIG. 1, the dashed block 180 includes five driving transistors 140 connected in parallel (e.g. driving transistor 140-1 to driving transistor 140-5). The equivalent circuit of these driving transistors 140 in the dashed block 180 can be shown as a layout 200, and the layout 200 is depicted in FIG. 2.

Figure 2:
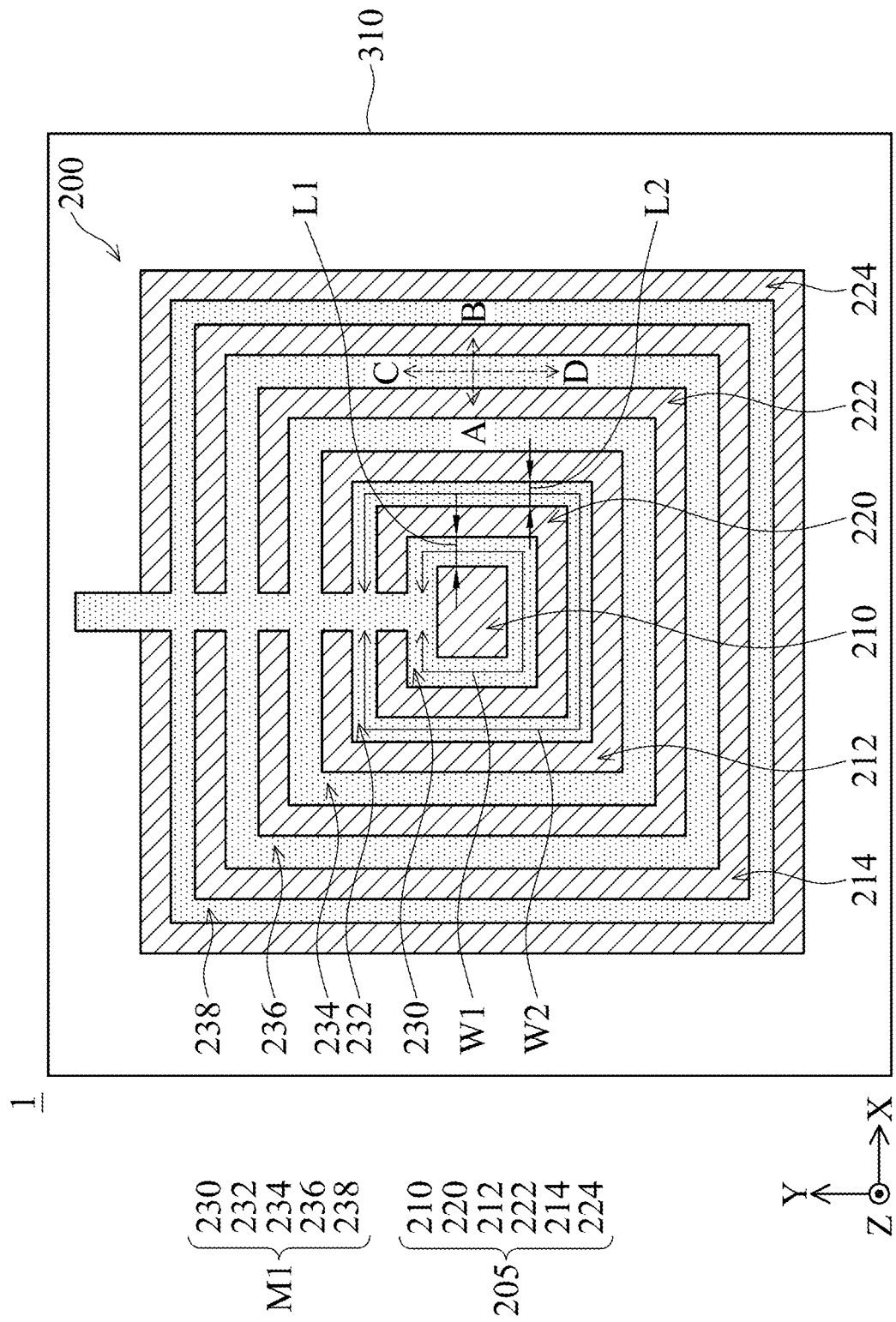
FIG. 2 is a top view illustrating a layout of driving transistors connected in parallel in the circuit, in accordance with some embodiments of the present disclosure.

FIG. 2 is a top view illustrating the layout 200 of the driving transistors 140 connected in parallel in the circuit 100 of FIG. 1, in accordance with some embodiments of the present disclosure. The layout 200 comprises a first metal layer M1 and a source/drain doped layer 205 (also referred to as a doped layer 205), such as a source doped layer or a drain doped layer. In some embodiments, the first metal layer M1 may be functioned as gates of the driving transistors 140. In particular, the first metal layer M1 may include a first gate 230, a second gate 232, a third gate 234, a fourth gate 236, and a fifth gate 238. In some embodiments, the source/drain doped layer 205 may include a first source doped layer 210, a first drain doped layer 220, a second source doped layer 212, a second drain doped layer 222, a third source doped layer 214, and a third drain doped layer 224.

The material of the first metal layer M1 may include aluminum (Al), copper (Cu), gold (Au), silver (Ag), tungsten (W), cobalt (Co), ruthenium (Ru), other suitable conductive materials, or combinations thereof, but the present disclosure is not limited thereto. The first metal layer M1 may be formed on the gate insulating layer (e.g. the gate insulating layer 350 discussed below with reference to FIG. 3) by suitable deposition processes, photolithography processes, and etching processes. In some embodiments, the photolithography processes may include photoresist coating (e.g., spin-on coating), soft baking, mask aligning, exposure, post-exposure baking, developing the photoresist, rinsing, and drying (e.g., hard baking). In other embodiments, the photolithography processes may be implemented or replaced by other suitable methods, such as maskless photolithography, electron-beam writing, and ion-beam writing.

In some embodiments, the etching processes may include dry etching, wet etching, reactive ion etching (RIE), and/or other suitable processes, but the present disclosure is not limited thereto. In some embodiments, the deposition processes of the first metal layer M1 may include PVD, CVD, sputter process, evaporation process, pulsed laser deposition process, LPCVD, LTCVD, RTCVD, PECVD, HDPCVD, MOCVD, RPCVD ALD, other suitable processes, and/or combinations thereof, but the present disclosure is not limited thereto. In some embodiments, the thickness (measured along the Z direction) of the first metal layer M1 may be greater than or equal to 0.05 micrometers and less than or equal to 0.5 micrometers, but the disclosure is not limited thereto.

In the layout 200, the first metal layer M1 and the source/drain doped layer 205 substantially alternatively surround each other in a concentric rectangular manner. For example, in the embodiment illustrated in FIG. 2, the center of the concentric rectangle is the first source doped layer 210, the first gate 230 surrounds the first source doped layer 210, the first drain doped layer 220 surrounds the first gate 230, the second gate 232 surrounds the first drain doped layer 220, the second source doped layer 212 surrounds the second gate 232, and the third gate 234 surrounds the second source doped layer 212. Next, the second drain doped layer 222 surrounds the third gate 234, the fourth gate 236 surrounds the second drain doped layer 222, the third source doped layer 214 surrounds the fourth gate 236, the fifth gate 238 surrounds the third source doped layer 214, and the third drain doped layer 224 surrounds the fifth gate 238. It is worth noting that, the "surround" referred to in this disclosure may include "fully surround" or "partially surround". For example, taking "the first gate 230 surrounds the first source doped layer 210" as an example, the first gate 230 may surround the first source doped layer 210 in 360 degrees, or the first gate 230 may also surround the first source doped layer 210 in greater than 270 degrees, but the present disclosure is not limited thereto.

Referring to FIG. 1 and FIG. 2, in the layout 200, the transistors can share a source doped layer or a drain doped layer with each other. For example, the first transistor (e.g. the driving transistor 140-1) and the second transistor (e.g. the driving transistor 140-2) share the first drain doped layer 220, the second transistor and the third transistor (e.g. the driving transistor 140-3) share the second source doped layer 212, the third transistor and the fourth transistor (e.g. the driving transistor 140-4) share the second drain doped layer 222, and the fourth transistor and the fifth transistor (e.g. the driving transistor 140-5) share the third source doped layer 214.

Although it is not shown in FIG. 2, the first metal layer M1 includes channel layers underneath, wherein the channel layers are interposed between sources and drains. More particularly, the channel layers may be disposed over the substrate 310, and the first metal layer M1 is disposed over the channel layers. In the present embodiment, the channel layers can include a first channel layer, a second channel layer, a third channel layer, a fourth channel layer, and a fifth channel layer. The first channel layer, the second channel layer, the third channel layer, the fourth channel layer, and the fifth channel layer are disposed corresponding to the first gate 230, the second gate 232, the third gate 234, the fourth gate 236, and the fifth gate 238, respectively. For example, the first gate 230 is disposed on the first channel layer, and the size of the first channel layer is substantially the same as the size of the first gate 230. The second gate 232 is disposed on the second channel layer, and the size of the second channel layer is substantially the same as the size of the second gate 232. The third gate 234 is disposed on the third channel layer, and the size of the third channel layer is substantially the same as the size of the third gate 234. The fourth gate 236 is disposed on the fourth channel layer, and the size of the fourth channel layer is substantially the same as the size of the fourth gate 236. The fifth gate 238 is disposed on the fifth channel layer, and the size of the fifth channel layer is substantially the same as the size of the fifth gate 238. It is worth noting that the "size" referred to in the present disclosure may include the maximum width in the X direction, the area in a top view direction, or the longest length in the Y direction, but the present disclosure is not limited thereto, as long as it can be clearly expressed and meets the purpose of the present disclosure.

According to some embodiments, the second channel layer surrounds the first channel layer, and the third channel layer surrounds the second channel layer. In some embodiments, the fourth channel layer surrounds the third channel layer, and the fifth channel layer surrounds the fourth channel layer.

In the layout 200, different transistors may have different channel widths and/or different channel lengths. Alternatively, different transistors may have different channel width to channel length ratios (also referred to as channel width-to-length ratios). In the layout 200, the first transistor (e.g. driving transistor 140-1) has a first channel width W1 and a first channel length L1, and the second transistor (e.g. driving transistor 140-2) has a second channel width W2 and a second channel length L2, as shown in FIG. 2. In some embodiments, the first channel width W1 is different from the second channel width W2. In some embodiments, the first channel length L1 is different from the second channel length L2. Alternatively, in some embodiments, the ratio (W1/L1) of the first channel width W1 to the first channel length L1 is different from the ratio (W2/L2) of the second channel width W2 to the second channel length L2. In other embodiments, the channel widths of other transistors in the layout 200 may be different from the first channel width W1 and/or the second channel width W2, and the channel lengths of other transistors in the layout 200 may be different from the first channel length L1 and/or the second channel length L2. Alternatively, other transistors may have different channel width to channel length ratios.

In general, the larger the channel width, the higher the current that the transistor can flow. Therefore, the transistors with different channel widths can provide different magnitudes of the current. In the embodiments of the present disclosure, since a plurality of transistors connected in parallel are used to provide current, a transistor with a larger channel width can provide a higher current to compensate for a transistor with a smaller channel width and providing less current. For example, when the current of some transistors is less than expected due to a problem in the manufacturing process, a transistor with a larger channel width can be used to provide a higher current to compensate for the lack of current.

It should be noted that, although the layout 200 in FIG. 2 illustrates five transistors connected in parallel, the present disclosure is not limited thereto. As described above, the present disclosure may comprise any suitable number of transistors, and the layout 200 may be modified accordingly. Those skilled in the art should be able to readily increase or decrease the number of source doped layers, drain doped layers, gates, and other elements of the layout 200 according to the number of transistors, and these modifications are all encompassed by the present disclosure.

Figure 3:
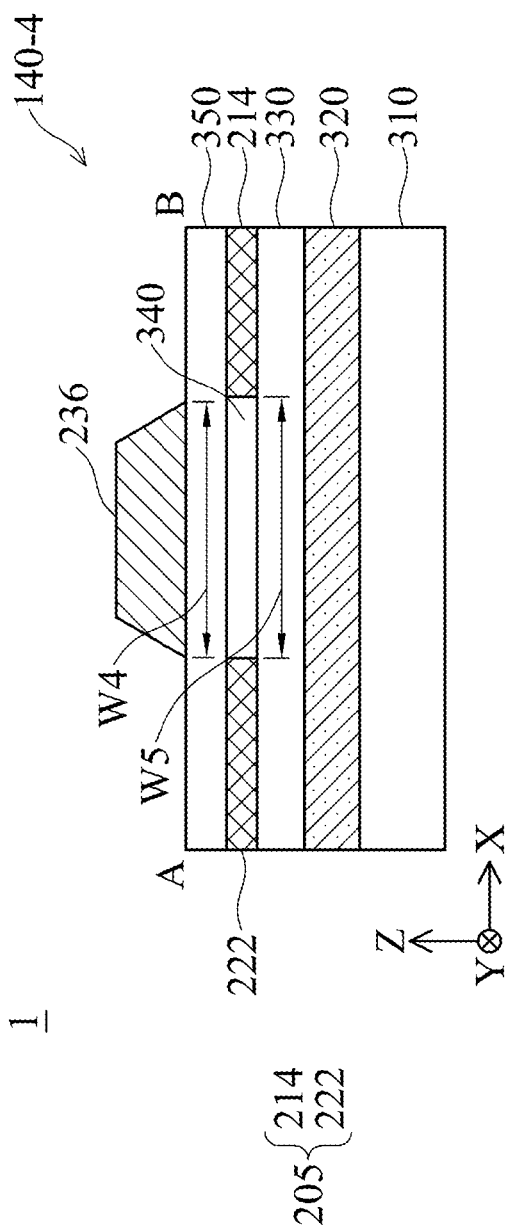
FIG. 3 is a cross-sectional view of the layout in FIG. 2, in accordance with some embodiments of the present disclosure.
Figure 4:
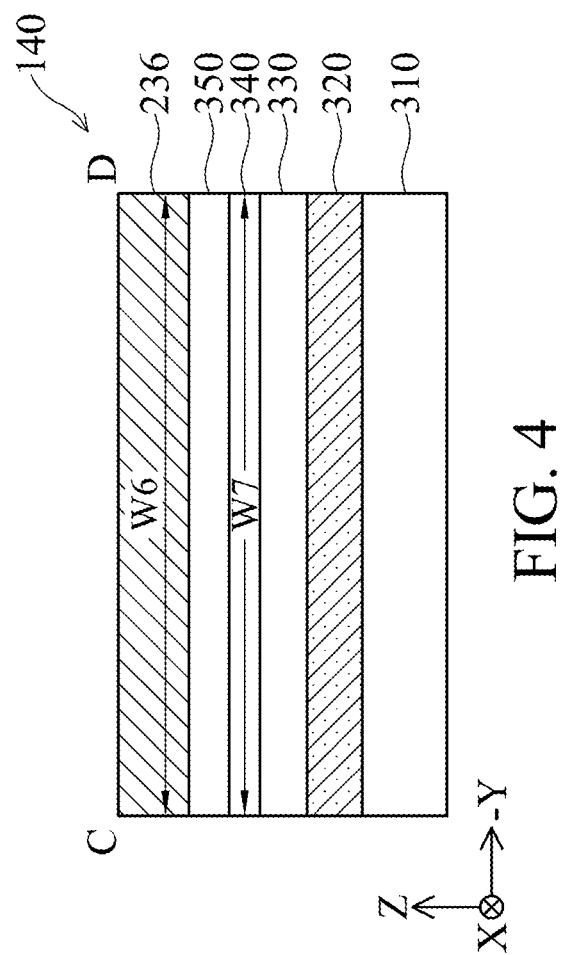
FIG. 4 is a cross-sectional view of the layout in FIG. 2, in accordance with some embodiments of the present disclosure.

FIG. 3 is a cross-sectional view of the layout 200 along a line A-B of FIG. 2, in accordance with some embodiments of the present disclosure. FIG. 3 shows a cross-sectional view of a driving transistor (e.g. driving transistor 140-4) in the X-Z plane. FIG. 4 is a cross-sectional view of the layout 200 along a line C-D of FIG. 2, in accordance with some embodiments of the present disclosure. FIG. 4 shows a cross-sectional view of the driving transistor (e.g. driving transistor 140-4) in the Y-Z plane.

As illustrated in FIG. 3, the display device 1 may include, but is not limited to the substrate 310, a first functional layer 320 such as a barrier layer, a second functional layer 330 such as a buffer layer, a channel layer 340, the third source doped layer 214, the second drain doped layer 222, a gate insulating layer 350, and the fourth gate 236. It should be noted that, for the purpose of clarity, the gate insulating layer 350 is not shown in FIG. 2. Instead, the doped layer 205 under the gate insulating layer 350 is shown in FIG. 2.

Each of the first functional layer 320 and the second functional layer 330 may include a single layer or multiple layers. The first functional layer 320 and the second functional layer 330 may include insulating materials. In some embodiments, the first functional layer 320 and the second functional layer 330 may include organic materials, inorganic materials, or combinations thereof, but the present disclosure is not limited thereto. For example, the organic materials may include polyethylene terephthalate (PET), polyethylene (PE), polyethersulfone (PES), polycarbonate (PC), polymethyl methacrylate (PMMA), isoprene, phenol-formaldehyde resin, benzocyclobutene (BCB), perfluorocyclobutane (PECB), or combinations thereof, but the present disclosure is not limited thereto. The inorganic material may include silicon oxide, silicon nitride, silicon oxynitride, aluminum oxide, aluminum nitride, aluminum oxynitride, titanium oxide, other suitable materials, or combinations thereof, but the present disclosure is not limited thereto.

In some embodiments, the first functional layer 320 and the second functional layer 330 may be formed on the substrate 310 by deposition processes. The deposition processes may include physical vapor deposition (PVD) process, chemical vapor deposition (CVD) process, coating process, other suitable processes, or combinations thereof. The PVD process may include sputter process, evaporation process, pulsed laser deposition process, etc., but the present disclosure is not limited thereto. The CVD process may include low-pressure CVD (LPCVD), low-temperature CVD (LTCVD), rapid thermal CVD (RTCVD), plasma enhanced CVD (PECVD), high density plasma CVD (HDPCVD), metal organic CVD (MOCVD), remote plasma CVD (RPCVD) process, atomic layer deposition (ALD) process, plating process, other suitable processes, and/or combinations thereof, but the present disclosure is not limited thereto. In some embodiments, the first functional layer 320 and the second functional layer 330 may be formed in different process chambers. In some embodiments, the thickness of the first functional layer 320 (measured along the Z direction) may be greater than or equal to 3000 Å (angstrom) and less than or equal to 7000 Å, but the present disclosure is not limited thereto. In some embodiments, the thickness of the second functional layer 330 (measured along the Z direction) may be greater than or equal to 500 Å and less than or equal to 3000 Å, but the present disclosure is not limited thereto.

A first material layer can be formed on the second functional layer 330, and the first material layer can be used to form the channel layer 340 and the doped layer 205 in subsequent processes. In other words, the first material layer includes, for example, the channel layer 340 and the doped layer 205. The material of the first material layer may be polysilicon (Poly-Si), amorphous silicon, indium gallium zinc oxide (IGZO), etc., but the present disclosure is not limited thereto. In some embodiments, the first material layer may be formed on the second functional layer 330 by deposition processes. The deposition processes may include PVD, CVD, sputter process, evaporation process, pulsed laser deposition process, LPCVD, LTCVD, RTCVD, PECVD, HDPCVD, MOCVD, RPCVD ALD, other suitable processes, and/or combinations thereof, but the present disclosure is not limited thereto. In some embodiments, the thickness of the first material layer (measured along the Z direction) may be greater than or equal to 100 Å and less than or equal to 600 Å, but the present disclosure is not limited thereto.

The material of the gate insulating layer 350 may include organic materials, such as polyimide (PI), polyethylene terephthalate (PET), polyethylene (PE), polyethersulfone (PES), polycarbonate (PC), polymethyl methacrylate (PMMA), isoprene, phenol-formaldehyde resin, benzocyclobutene (BCB), perfluoro-cyclobutane (PECB), or combinations thereof, but the present disclosure is not limited thereto. In some embodiments, the gate insulating layer 350 may be formed on the first material layer by deposition processes. The deposition processes may include PVD, CVD, sputter process, evaporation process, pulsed laser deposition process, LPCVD, LTCVD, RTCVD, PECVD, HDPCVD, MOCVD, RPCVD ALD, other suitable processes, and/or combinations thereof, but the present disclosure is not limited thereto. In some embodiments, the thickness of the gate insulating layer 350 (measured along the Z direction) may be greater than or equal to 500 Å and less than or equal to 3000 Å, but the present disclosure is not limited thereto.

According to some embodiments, after the first metal layer M1 is formed, the first metal layer M1 may be functioned as an implanting mask for doping the first material layer. In some embodiments, an ion implantation process can be performed to dope dopants into the region of the first material layer that is not masked by the first metal layer M1 to form heavily doped source/drain regions, such as heavily doped p-type polysilicon ($P^+$ Poly-Si). These heavily doped source/drain regions form the doped layer 205. In addition, the region of the first material layer that is not doped with dopants forms the channel layer 340. The channel layer 340 is functioned as the channel of driving transistor 140.

In an embodiment where the driving transistors 140 are p-type transistors, the dopant may be a p-type dopant such as boron, but the present disclosure is not limited thereto. In the embodiment where the driving transistors 140 are n-type transistors, the dopant may be an n-type dopant such as phosphorus or arsenic, but the present disclosure is not limited thereto.

It can be ensured that the width of the channel layer below the gate is substantially equal to the gate width by using the gate (e.g. the first metal layer M1) as the implanting mask. More particularly, it can be ensured that in the normal direction of the substrate (e.g. the Z direction), the gate width is substantially equal to the width of the channel layer. Referring to FIG. 3, in the direction (X direction) perpendicular to the normal direction (Z direction) of the substrate, the width W4 of the first metal layer M1 (e.g. the fourth gate 236) is substantially equal to the width W5 of the channel layer 340 in the X direction. Referring to FIG. 4, the width W6 of the first metal layer M1 (e.g. the fourth gate 236) in the Y direction is substantially equal to the width W7 of the channel layer 340 in the Y direction.

Through the layout 200 shown in FIG. 2 and the corresponding processes, the channel layer 340 and the gate insulating layer 350 with uniform thickness can be formed. Moreover, in the direction (e.g. the X direction) perpendicular to the normal direction (e.g. Z direction) of the substrate, the gate and the channel layer having substantially the same width are formed. As a result, the sloped profile of the edge regions on both sides of the channel layer can be eliminated, that is, the gate insulating layer 350 near the edge of the channel layer 340 will not have a slope. As shown in FIG. 3 and FIG. 4, since the width of the channel layer 340 is substantially the same as the width of the gate (e.g. the fourth gate 236), and each of the channel layer 340 and the gate insulating layer 350 has a substantially uniform thickness, the edge regions on both sides of the channel layer do not have a sloped profile. As a result, the probability of generating edge transistors or the probability of electrons or holes being captured by the gate insulating layer can be reduced. Therefore, the hump effect can be suppressed and/or the reliability of the transistors can be increased.

Figure 5:
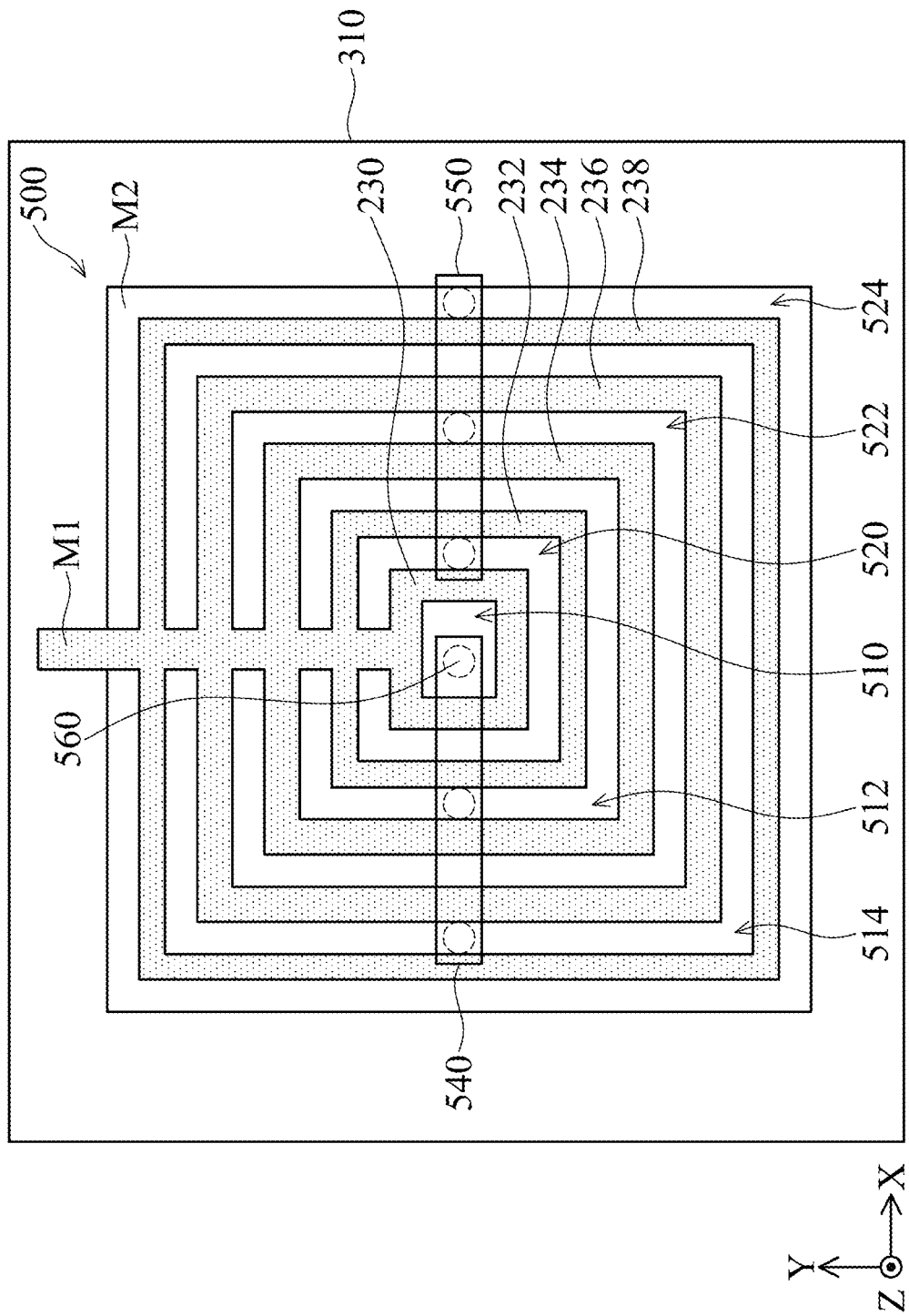
FIG. 5 is a top view illustrating a layout of driving transistors connected in parallel in the circuit, in accordance with some embodiments of the present disclosure.

After the doped layer 205 is formed by implantation, subsequent processes can be performed to form a second metal layer M2, wherein the second metal layer M2 is functioned as source/drain and shown in FIG. 5. In some embodiments, referring to FIG. 3, an interlayer dielectric (ILD) layer (not shown) may be formed on the gate insulating layer 350 and the first metal layer M1 (e.g. the fourth gate 236). The ILD layer may include dielectric materials, such as tetraethylorthosilicate (TEOS), un-doped silicate glass (USG), or doped silicon oxide such as borophosphosilicate glass (BPSG), fused silica glass (FSG), phosphosilicate glass (PSG), boron doped silicon glass (BSG), other suitable dielectric materials, or combinations thereof, but the present disclosure is not limited thereto. The ILD layer may be formed by deposition processes, such as PVD, CVD, sputtering, evaporation, pulsed laser deposition, LPCVD, LTCVD, RTCVD, PECVD, HDPCVD, MOCVD, RPCVD, ALD, other suitable processes, and/or combinations thereof, but the present disclosure is not limited thereto.

Then, vias to the doped layer 205 can be formed in the interlayer dielectric layer by etching processes. The etching processes may include dry etching, wet etching, reactive ion etching (RIE), and/or other suitable processes, but the present disclosure is not limited thereto.

After forming the vias, a conductive material can be formed in the vias by deposition processes. The conductive material may include aluminum (Al), copper (Cu), gold (Au), silver (Ag), tungsten (W), cobalt (Co), ruthenium (Ru), other suitable conductive materials, or combinations thereof, but the present disclosure is not limited thereto. The deposition processes may include PVD, CVD, sputtering, evaporation, pulsed laser deposition, LPCVD, LTCVD, RTCVD, PECVD, HDPCVD, MOCVD, RPCVD, ALD, other suitable processes, and/or combinations thereof, but the present disclosure is not limited thereto.

Next, the second metal layer M2 can be formed on the vias by using suitable deposition processes, retching processes, and/or photolithography processes. In some embodiments, the second metal layer M2 is higher than the first metal layer M1 in the Z direction. In other words, the second metal layer M2 is disposed over the first metal layer M1. The second metal layer M2 may include aluminum (Al), copper (Cu), gold (Au), silver (Ag), tungsten (W), cobalt (Co), ruthenium (Ru), other suitable conductive materials, or combinations thereof, but the present disclosure is not limited thereto.

In some embodiments, the photolithography processes include photoresist coating, soft baking, mask aligning, exposure, post-exposure baking, developing the photoresist, rinsing, and drying. In other embodiments, the photolithography processes may be implemented or replaced by other suitable methods, such as maskless photolithography, electron-beam writing, and ion-beam writing. The etching processes may include dry etching, wet etching, RIE, and/or other suitable processes, but the present disclosure is not limited thereto. The deposition processes may include PVD, CVD, sputtering, evaporation, pulsed laser deposition, LPCVD, LTCVD, RTCVD, PECVD, HDPCVD, MOCVD, RPCVD, ALD, other suitable processes, and/or combinations thereof, but the present disclosure is not limited thereto.

FIG. 5 is a top view illustrating a layout 500 of driving transistors 140 connected in parallel in the circuit 100, in accordance with some embodiments of the present disclosure. After the second metal layer M2 is formed, the relationship between the first metal layer M1 and the second metal layer M2 is as shown in FIG. 5. Similar to the source/drain doped layer 205, in FIG. 5, the first metal layer M1 and the second metal layer M2 substantially alternatively surround each other in a concentric rectangular manner. The elements included in the layout 500 are similar to those included in the layout 200, except that the layout 500 shows that the second metal layer M2 is disposed on the first metal layer M1. The layout 500 further shows a first conductive feature 540 for connecting the source and a second conductive feature 550 for connecting the drain.

Referring to FIG. 2 and FIG. 5, the second metal layer M2 comprises a first source 510 (connected with the first source doped layer 210), a first drain 520 (connected with the first drain doped layer 220), a second source 512 (connected with the second source doped layer 212), a second drain 522 (connected with the second drain doped layer 222), a third source 514 (connected with the third source doped layer 214), and a third drain 524 (connected with the third drain doped layer 224). As described above, the second metal layer M2 can be electrically connected with the underlying doped layer through vias (not shown).

The first source 510, the first drain 520, the first gate 230 between the first source 510 and the first drain 520, and the first channel layer corresponding to the first gate 230 may form a first transistor (e.g. the driving transistor 140-1). Similarly, the second source 512, the first drain 520, the second gate 232, and the second channel layer corresponding to the second gate 232 may form a second transistor (e.g. the driving transistor 140-2). The second source 512, the second drain 522, the third gate 234, and the third channel layer corresponding to the third gate 234 may form a third transistor (e.g. the driving transistor 140-3). The second drain 522, the third source 514, the fourth gate 236, and the fourth channel layer corresponding to the fourth gate 236 may form a fourth transistor (e.g. the driving transistor 140-4). The third source 514, the third drain 524, the fifth gate 238, and the fifth channel layer corresponding to the fifth gate 238 may form a fifth transistor (e.g. the driving transistor 140-5).

In some embodiments, the transistors may further include doped layers. For example, the first transistor may include the first source doped layer 210 and the first drain doped layer 220. The second transistor may include the first drain doped layer 220 and the second source doped layer 212. The third transistor may include the second source doped layer 212 and the second drain doped layer 222. The fourth transistor may include the second drain doped layer 222 and the third source doped layer 214. The fifth transistor may include the third source doped layer 214 and the third drain doped layer 224.

In some embodiments, referring to FIG. 2 and FIG. 5, the first source 510 is disposed corresponding to the first source doped layer 210. The first drain 520 is disposed corresponding to the first drain doped layer 220. The second source 512 is disposed corresponding to the second source doped layer 212. The second drain 522 is disposed corresponding to the second drain doped layer 222. The third source 514 is disposed corresponding to the third source doped layer 214. The third drain 524 is disposed corresponding to the third drain doped layer 224. According to some embodiments, the first gate 230 surrounds the first source 510, and the first drain 520 surrounds the first gate 230. In some embodiments, the second gate 232 surrounds the first drain 520, the second source 512 surrounds the second gate 232, the third gate 234 surrounds the second source 512, and the second drain 522 surrounds the third gate 234. In some embodiments, the fourth gate 236 surrounds the second drain 522, the third source 514 surrounds the fourth gate 236, the fifth gate 238 surrounds the third source 514, and the third drain 524 surrounds the fifth gate 238.

According to some embodiments, the five transistors described above (i.e. the first transistor, the second transistor, the third transistor, the fourth transistor, and the fifth transistor) can be connected in parallel by using conductive features. For example, referring to FIG. 1 and FIG. 5, the layout 500 comprises the first conductive feature 540 for connecting the source, and the second conductive feature 550 for connecting the drain. In the embodiment illustrated in FIG. 5, the first conductive feature 540 is electrically connected to the first source 510, the second source 512, and the third source 514, for example, connected to by vias 560. The second conductive feature 550 is electrically connected to the first drain 520, the second drain 522, and the third drain 524, for example, connected to by vias 560. In some embodiments, the first conductive feature 540 is used to provide source voltage for the transistors. In some embodiments, the second conductive feature 550 electrically connects the drains of the transistors to the light-emitting unit 160 to provide current for the light-emitting unit 160. For example, the first conductive feature 540 and the second conductive feature 550 may be metal layers or other conductive structures.

Similar to the layout 200, in the layout 500, transistors can share sources or drains with each other. For example, the first transistor and the second transistor share the first drain 520, the second transistor and the third transistor share the second source 512, the third transistor and the fourth transistor share the second drain 522, and the fourth transistor and the fifth transistor share the third source 514.

Figure 6:
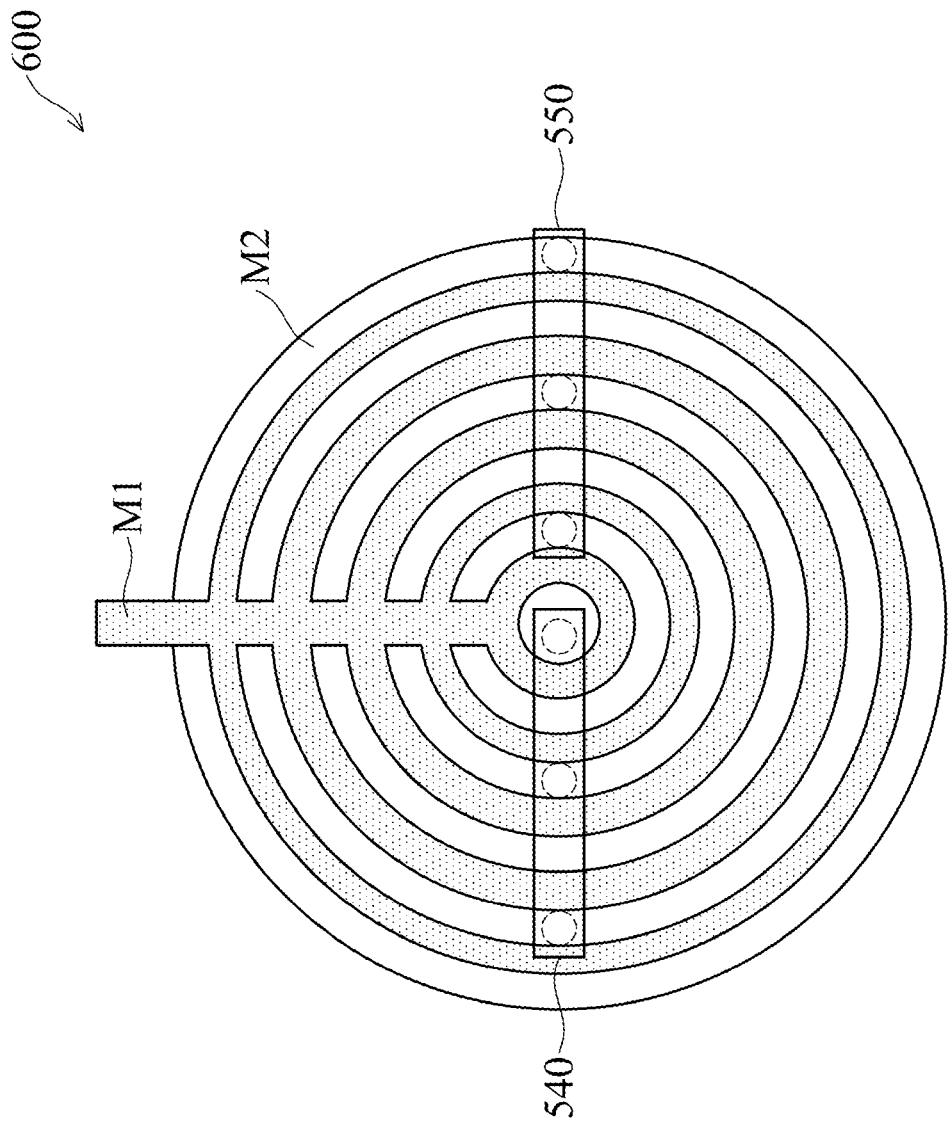
FIG. 6 is a top view illustrating a layout of driving transistors connected in parallel in the circuit, in accordance with some embodiments of the present disclosure.

FIG. 6 is a top view illustrating a layout 600 of driving transistors 140 connected in parallel in the circuit 100, in accordance with some embodiments of the present disclosure. Referring to FIG. 1 and FIG. 6, the layout 600 has the same elements as the layout 500, such as the first metal layer M1, the second metal layer M2, the first conductive feature 540, the second conductive feature 550, and so on. The difference between the layout 600 and the layout 500 is that the first metal layer M1 and the second metal layer M2 of the layout 500 are disposed in a substantially concentric rectangular manner, while the first metal layer M1 and the second metal layer M2 of the layout 600 are disposed in a substantially concentric circular manner.

The layout 600 of the driving transistors 140 also has cross-sectional views as shown in FIG. 3 and FIG. 4. The driving transistors 140 in FIG. 6 may be formed by the same or similar processes as that of forming the transistors 140 in FIG. 2 to FIG. 5, and it will not be repeated herein. Since the similar processes are used, the layout 600 can have similar advantages to the layout 500 (and the layout 200).

Similar to the layout 200, through the layout 600 and corresponding processes, the channel layer and the gate insulating layer with uniform thickness can be formed. Moreover, the gate and the channel layer having substantially the same width in the direction (e.g. the X direction) perpendicular to the normal direction (e.g. Z direction) of the substrate can be formed. As a result, the sloped profile of the edge regions on both sides of the channel layer can be decreased. As shown in FIG. 3 and FIG. 4, since the width of the channel layer is the same as the width of the gate, and each of the channel layer and the gate insulating layer has a substantially uniform thickness, the edge regions on both sides of the channel layer do not have a sloped profile. As a result, the probability of generating edge transistors or the probability of electrons or holes being captured by the gate insulating layer can be reduced. Therefore, the hump effect can be suppressed and/or the reliability of the transistors can be increased.

After the doped layer is formed by the implantation process using the gate as the implanting mask, subsequent processes may be performed to form the second metal layer M2 as the source/drain. In some embodiments, the second metal layer M2 may be formed by the processes described above (e.g. forming the ILD layer, forming vias, forming conductive materials, and forming the second metal layer M2), and it will not be repeated herein.

In some other embodiments, the layout of the driving transistors 140 connected in parallel in the circuit 100 may have a shape that is different from concentric rectangles (e.g. FIG. 2 and FIG. 5) and concentric circles (e.g. FIG. 6). For example, in other layouts, the first metal layer M1 and the second metal layer M2 may be disposed in a substantially concentric ellipse, a substantially concentric triangle, a substantially concentric pentagon, or a substantially concentric polygon, etc., but the present disclosure is not limited thereto.

These embodiments also have cross-sectional views as shown in FIG. 3 and FIG. 4. Therefore, in these embodiments, since the width of the channel layer is the same as the width of the gate, and each of the channel layer and the gate insulating layer has a substantially uniform thickness, the edge regions on both sides of the channel layer do not have a sloped profile. As a result, the sloped profile of the edge regions on both sides of the channel layer can be reduced. Therefore, the probability of generating edge transistors or the probability of electrons or holes being captured by the gate insulating layer can be reduced. As a result, these embodiments can suppress the hump effect and/or increase the reliability of the transistors.

In these embodiments, the same processes as in FIG. 2 to FIG. 5 can also be used to form the driving transistors, and it will not be repeated herein. Similarly, in these embodiments, after the doped layer is formed, subsequent processes may be performed to form the second metal layer as the source/drain electrodes.

By implementing the embodiments having different layout shapes (e.g. concentric rectangles, concentric circles, concentric polygons, etc.) of the present disclosure, the pattern layout on the substrate can be more flexible. For example, a suitable layout shape can be disposed according to the shape of the unpatterned region on the substrate. As a result, the limited substrate area can be utilized more effectively.

It should be noted that, the transistors in the drawings of the present disclosure are all gate-top thin film transistors as examples. However, in other embodiments, the transistors may be gate-bottom thin film transistors. Alternatively, in yet other embodiments, the transistors may be other types of transistors different from the thin film transistor.

According to the embodiments provided in the present disclosure, a plurality of transistors (e.g. driving transistors) in a circuit of an electronic device (e.g. a display device) can be effectively integrated in parallel. As a result, the total current can be increased and the current borne by each transistor can be reduced at the same time. Therefore, the durability and lifetime of the transistors can be improved. Also according to the embodiments provided in the present disclosure, by forming the channel layer and the gate insulating layer with uniform thickness, and forming the channel layer and the gate with the same width, the sloped profile of the edge regions on both sides of the channel layer can be reduced. As a result, the probability of generating edge transistors and/or the probability of electrons or holes being captured by the gate insulating layer can be reduced. Therefore, the hump effect can be suppressed and/or the reliability of the transistors can be increased.

In addition, according to the embodiments provided in the present disclosure, the transistors in parallel may have different channel width-to-length ratios, and thus the transistors may have different currents. As a result, a transistor with a higher current can be used to compensate for a transistor that cannot provide sufficient current for some reason. Therefore, the failure rate of the circuit can be reduced. Also according to the embodiments provided in the present disclosure, combining the embodiments with different layout shapes can make the pattern layout of the substrate more flexible. As a result, the limited substrate area can be used more effectively.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A display device, comprising:
a substrate;
a channel layer, disposed on the substrate and including a first channel layer and a second channel layer;
a first metal layer, disposed on the channel layer and including a first gate and a second gate; and
a second metal layer, disposed over the first metal layer and including a first source, a first drain, and a second source;
wherein the first gate, the first source, the first drain, and the first channel layer form a first transistor;
wherein the second gate, the second source, the first drain, and the second channel layer form a second transistor, and wherein the first transistor and the second transistor are connected in parallel;

wherein in a top view, the first gate surrounds the first source, and the first drain surrounds the first gate.

2. The display device as claimed in claim 1, wherein the first gate surrounds the first source in a concentric rectangular manner, and the first drain surrounds the first gate in a concentric rectangular manner.

3. The display device as claimed in claim 1, wherein the first gate surrounds the first source in a concentric circular manner, and the first drain surrounds the first gate in a concentric circular manner.

4. The display device as claimed in claim 1, further comprising a gate insulating layer, disposed between the channel layer and the first metal layer.

5. The display device as claimed in claim 4, wherein the channel layer has a substantially uniform thickness, and the gate insulating layer has a substantially uniform thickness.

6. The display device as claimed in claim 1, further comprising a doped layer, wherein the doped layer comprises:
a first source doped layer, disposed under the first source;
a first drain doped layer, disposed under the first drain; and
a second source doped layer, disposed under the second drain.

7. The display device as claimed in claim 6, wherein the first source doped layer, the first drain doped layer, and the second source doped layer are connected to the first source, the first drain, and the second source through vias.

8. The display device as claimed in claim 1, wherein a first channel width-to-length ratio of the first channel layer of the first transistor is different from a second channel width-to-length ratio of the second channel layer of the second transistor, wherein the first channel width-to-length ratio is defined as a ratio of a width of the first channel layer to a length of the first channel layer, and the second channel width-to-length ratio is defined as a ratio of a width of the second channel layer to a length of the second channel layer.

9. The display device as claimed in claim 1, wherein the substrate has a normal direction, and wherein in a direction perpendicular to the normal direction, a width of the first channel layer is the same as a width of the first gate.

10. The display device as claimed in claim 9, wherein in the direction perpendicular to the normal direction, a width of the second channel layer is the same as a width of the second gate.

11. The display device as claimed in claim 1, wherein the channel layer further includes a third channel layer, the first metal layer further includes a third gate, and the second metal layer further includes a second drain, and wherein the third channel layer, the third gate, the second source, and the second drain form a third transistor, and wherein the third transistor is connected in parallel with the first transistor and the second transistor.

12. The display device as claimed in claim 11, wherein the substrate has a normal direction, and wherein in a direction perpendicular to the normal direction, a width of the third channel layer is the same as a width of the third gate.

13. The display device as claimed in claim 11, wherein the first gate surrounds the first source, the first drain surrounds the first gate, the second gate surrounds the first drain, the second source surrounds the second gate, the third gate surrounds the second source, and the second drain surrounds the third gate.

14. The display device as claimed in claim 13, wherein the first source, the first gate, the first drain, the second gate, the second source, the third gate, and the second drain alternately surround each other in a concentric rectangular manner.

15. The display device as claimed in claim 13, wherein the first source, the first gate, the first drain, the second gate, the second source, the third gate, and the second drain alternately surround each other in a concentric polygonal manner.

16. The display device as claimed in claim 11, wherein the second channel layer surrounds the first channel layer, and the third channel layer surrounds the second channel layer.

17. The display device as claimed in claim 11, further comprising a second conductive feature, wherein the second conductive feature is electrically connected to the first drain and the second drain.

18. The display device as claimed in claim 17, wherein the second conductive feature is connected to a light-emitting unit.

19. The display device as claimed in claim 1, further comprising a first conductive feature, wherein the first conductive feature is electrically connected to the first source and the second source.

* * * * *